(12) United States Patent
Vimercati

(10) Patent No.: US 10,600,467 B2
(45) Date of Patent: Mar. 24, 2020

(54) OFFSET COMPENSATION FOR FERROELECTRIC MEMORY CELL SENSING

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/536,050

(22) Filed: Aug. 8, 2019

(65) Prior Publication Data

US 2020/0035285 A1  Jan. 30, 2020

Related U.S. Application Data

(63) Continuation of application No. 15/844,154, filed on Dec. 15, 2017, now Pat. No. 10,438,642, which is a continuation of application No. 15/377,767, filed on Dec. 13, 2016, now Pat. No. 9,858,978, which is a continuation of application No. 15/067,838, filed on Mar. 11, 2016, now Pat. No. 9,552,864.

(51) Int. Cl.
*G11C 11/22* (2006.01)
*G11C 7/06* (2006.01)

(52) U.S. Cl.
CPC ........ *G11C 11/221* (2013.01); *G11C 11/2273* (2013.01); *G11C 11/2275* (2013.01); *G11C 7/062* (2013.01)

(58) Field of Classification Search
CPC .... G11C 11/221; G11C 11/2273; G11C 7/062

USPC ......................................... 365/145, 149, 154
See application file for complete search history.

(56) References Cited

U.S. PATENT DOCUMENTS 6,920,060 B2   7/2005   Chow et al.
7,106,617 B2   9/2006   Jeon et al.
7,477,536 B2   1/2009   Jeon et al.
(Continued)

OTHER PUBLICATIONS

IPO, "Office Action," issued in connection with ROC (Taiwan) Patent Application No. 106108080, dated Dec. 12, 2017 (3 pages).
(Continued)

*Primary Examiner* — Han Yang
(74) *Attorney, Agent, or Firm* — Holland & Hart LLP

(57) ABSTRACT

Methods, systems, and devices for operating a ferroelectric memory cell or cells are described. Offsets in the threshold voltage of switching components (e.g., transistors) connected to digit lines may be compensated by using various operating techniques or additional circuit components, or both. For example, a switching component connected to a digit line may also be connected to an offset capacitor selected to compensate for a threshold voltage offset. The offset capacitor may be discharged in conjunction with a read operation, resulting in a threshold voltage applied to the switching component. This may enable all or substantially all of the stored charge of the ferroelectric memory cell to be extracted and transferred to a sense capacitor through the transistor. A sense amplifier may compare the voltage of the sense capacitor to a reference voltage in order to determine the stored logic state of the memory cell.

20 Claims, 10 Drawing Sheets

(56) References Cited

U.S. PATENT DOCUMENTS

| | | |
|---|---|---|
| 7,529,115 B2 | 5/2009 | Yamamura |
| 7,869,252 B2 | 1/2011 | Koide |
| 8,045,388 B2 | 10/2011 | Ogawa et al. |
| 2008/0170445 A1 | 7/2008 | Mori |
| 2009/0010054 A1 | 1/2009 | Kang et al. |
| 2009/0129175 A1* | 5/2009 | Masuda .................. G11C 7/12 |
| | | 365/189.09 |
| 2011/0155910 A1 | 6/2011 | Koide |
| 2014/0192035 A1* | 7/2014 | Tai .................... H01L 27/14643 |
| | | 345/211 |

OTHER PUBLICATIONS

IPO, "Office Action," issued in connection with ROC (Taiwan) Patent Application No. 107115887, dated Mar. 4, 2019 (7 pages).
ISA/KR, International Search Report and Written Opinion of the International Searching Authority, Int'l Appl. No. PCT/US2017/021884, dated Jun. 5, 2017, Korean Intellectual Property Office, Seo-gu, Daejeon, Republic of Korea, 10 pgs.

* cited by examiner

OFFSET COMPENSATION FOR FERROELECTRIC MEMORY CELL SENSING

CROSS REFERENCE

The present Application for Patent is a continuation of U.S. patent application Ser. No. 15/844,154 by Vimercati, entitled "Offset Compensation for Ferroelectric Memory Cell Sensing," filed Dec. 15, 2017, which is a continuation of U.S. patent application Ser. No. 15/377,767 by Vimercati, entitled "Offset Compensation for Ferroelectric Memory Cell Sensing," filed Dec. 13, 2016, which is a continuation of U.S. patent application Ser. No. 15/067,838 by Vimercati, entitled "Offset Compensation for Ferroelectric Memory Cell Sensing," filed Mar. 11, 2016, assigned to the assignee hereof, and each of which is expressly incorporated by reference herein.

BACKGROUND

The following relates generally to memory devices and more specifically to offset compensation for ferroelectric memory cell sensing.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Multiple types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain features of volatile memory may offer performance advantages, such as faster read or write speeds, while features of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM sensing schemes may, however, extract only a fraction of the ferroelectric capacitor's stored charge when determining the stored logic state. This may reduce the reliability of sensing operations or may limit memory cell (or array) size reductions that could otherwise be made.

BRIEF DESCRIPTION OF THE DRAWINGS

Embodiments of the disclosure are described with reference to the following figures.

DETAILED DESCRIPTION

Figure 1:
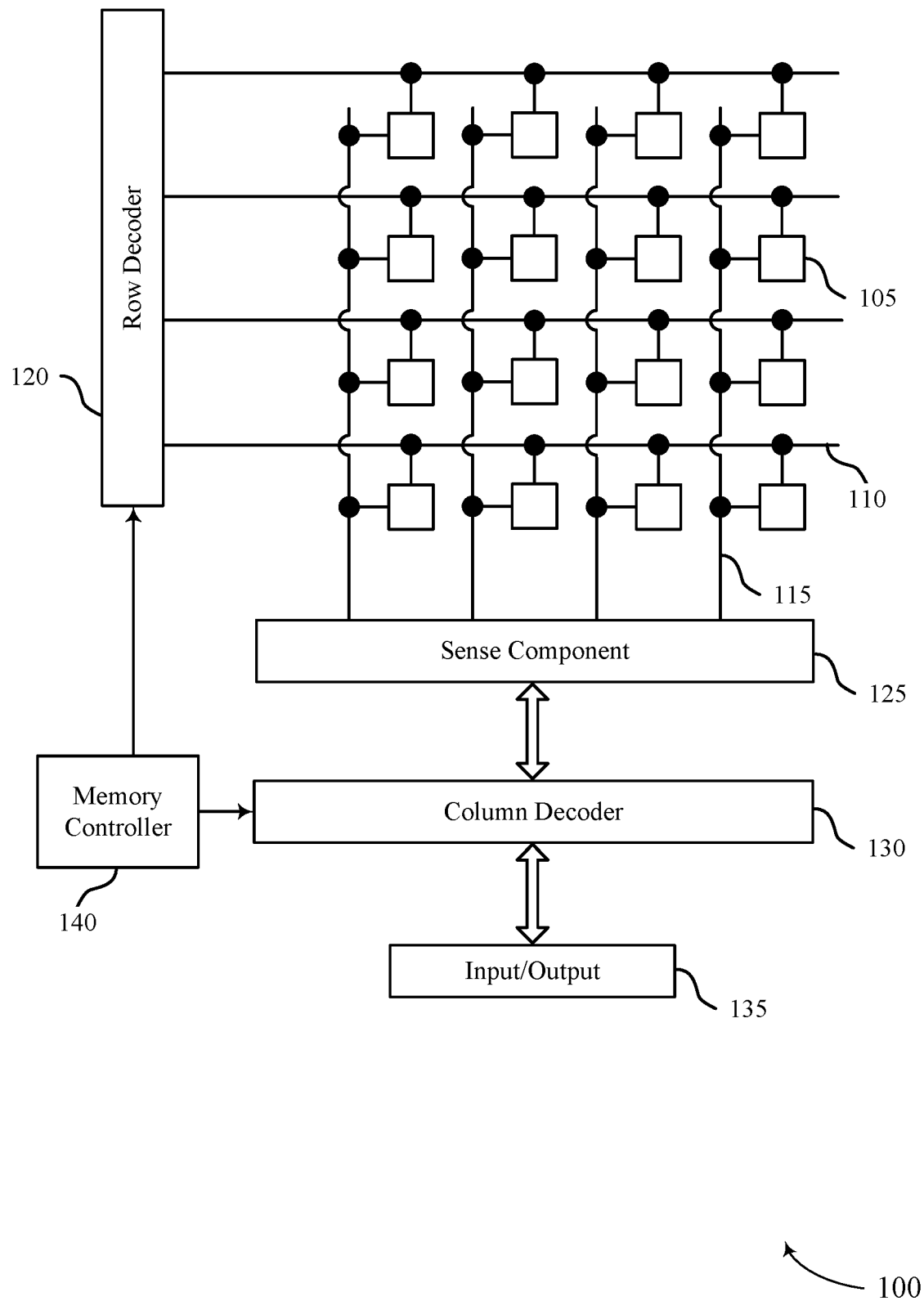
FIG. 1 illustrates an example memory array that supports offset compensation for ferroelectric memory cell sensing in accordance with various embodiments of the present disclosure.

Increased sensing reliability for memory cells may be realized with a sensing scheme that compensates for a transistor offset voltage. For example, a transistor or other switching component may be used to connect a digit line of a memory array to a sense amplifier used for sensing (i.e., reading) a logic value stored in a memory cell. When activated, the transistor may virtually ground the digit line during memory cell sensing. As described below, digit-line grounding may facilitate full charge extraction from a memory cell, which, in turn, may increase reliability of the sensing operation. Variations in the transistor threshold voltage may, however, affect the charge transfer from the memory cell, which may result in an increase in the digit line voltage during sensing. That is, the variations of the transistor may cause the digit line voltage to increase or may cause a voltage drop across the transistor during a read operation. This may reduce the signal strength used to determine the stored logic state of the memory cell, thus reducing sense reliability.

Memory cells, including FeRAM cells, within a memory array are often accessed by a word line and a digit line. A single digit line may connect many memory cells and may be connected to a sense amplifier that, when activated, may determine the stored logic state of a memory cell. To facilitate full charge extraction and thus increase signal strength used for sense operation, a digit line may be grounded during a sense operation and the full charge of a ferroelectric capacitor may be shared with a sense capacitor—i.e., a capacitor, which may be an feature of a sense amplifier, used for a sense or read operation.

A sensing scheme in which the digit line is grounded and a sense capacitor employed is in contrast to FeRAM sensing schemes that rely on or are subject to the intrinsic capacitance of the digit line to sense a state was stored in the memory cell. In schemes that rely on a digit line for sensing, when the memory cell is accessed, charge sharing between the memory cell and the digit line may cause a voltage to develop on the digit line. The amount of charge transferred to the digit line, and thus the final digit line voltage, may depend on the stored logic state of the memory cell. The voltage of the digit line may effectively reduce the amount of charge used to sense the stored logic of the ferroelectric memory cell. But a sensing scheme that prevents the digit line from developing a non-zero voltage during read operations may allow all or substantially all stored charge to be extracted from the ferroelectric memory cell. This may increase the sense window because the increase in extracted charge may, as described below, result in a higher signal for the sense amplifier.

The digit line may be virtually grounded during sensing by activating a switching component that is in electronic communication with the digit line. The switching component (also referred to as a switching device) may be a transistor, such as a p-type field-effect transistor (FET), which may be activated by applying a voltage equal to its threshold voltage. Transistor threshold voltages may vary, for example, due to variations in the transistor dimensions, material properties, or manufacturing. Thus, different transistors may react differently to the same applied voltage. For example, the voltage applied to a given transistor may not sufficiently activate the transistor. If the transistor is connected to a digit line, a failure to sufficiently or timely activate the transistor may cause the digit line to increase in voltage until the transistor activates, thus decreasing the total extracted charge from the memory cell and the sense window.

Threshold voltage offset may increasingly limit the performance of memory arrays as the size of electronic components, such as transistors, continue to decrease and manufacturing challenges resultantly increase. That is, variations in transistor properties, including voltage offsets, may be more pronounced in components that are relatively smaller than earlier generations of a similar component. In some cases, the design or operation of a memory array may depend on the largest variation in threshold voltage. For example, the largest accommodated offset may dictate the smallest possible transistor size, or the voltages used to control circuit operations may be selected to accommodate the largest offset of the array. Thus, threshold voltage offset (also referred to as threshold offset) may reduce memory array performance or may limit potential cost savings associated with smaller components of memory arrays, or both.

As disclosed herein, offsets in a threshold voltage of transistors connected to digit lines may be compensated for or canceled out. The transistor may be connected to an offset capacitor that may be discharged, resulting in a threshold voltage applied to the transistor. Operating the transistor at its threshold voltage may virtually ground the digit line during sensing and may enable complete or nearly complete charge extraction from the memory cell. Extracted charge may be transferred to a sense capacitor that may be used to determine the stored logic state of the memory cell. Additionally, offset compensation may enable further shrinking of component size, resulting in increased memory cell density and decreased manufacturing cost.

In some cases, a single conductive element, such as a common signal line, may activate more than one transistor, and the offset of each transistor may be compensated. For example, two transistors may each be in electronic communication with an offset capacitor, and a common signal line may charge and discharge each capacitor in order to activate both transistors. Thus, a single voltage applied to the signal line may result in applying a threshold voltage to each transistor, even if their threshold voltages differ. This may be beneficial when generating a reference signal to determine the stored logic state of the memory cell. For example, a reference signal may be generated by operating a reference component. The reference signal may depend on operating a second switching component, such as a second p-type FET, at its threshold voltage, where both FETs are operated by a common signal line. If the second offset is not corrected, the reference signal may be reduced in strength and, resultantly, may reduce the margin for sensing, i.e., the difference between the reference signal and the memory cell signal.

Embodiments of the disclosure introduced above are further described below in the context of a memory array. Specific examples are then described for a circuit that supports offset compensation to virtually ground a digit line while sensing a memory cell. An example timing plot of the circuit is also presented. These and other embodiments of the disclosure are further illustrated by and described with reference to apparatus diagrams, system diagrams, and flowcharts that relate to offset compensation, including compensation, for ferroelectric memory cell sensing.

FIG. 1 illustrates an example memory array 100 that supports offset compensation for ferroelectric memory cell sensing in accordance with various embodiments of the present disclosure. Memory array 100 may also be referred to as an electronic memory apparatus. Memory array 100 includes memory cells 105 that are programmable to store different states, for example, two states denoted logic 0 and logic 1. In some cases, memory cell 105 is configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties and some of the details and advantages of a ferroelectric memory cell 105 are discussed below.

Operations such as reading and writing may be performed on memory cells 105 by activating or selecting the appropriate word line 110 and digit line 115. Activating or selecting a word line 110 or a digit line 115 may include applying a voltage to the respective line. In some cases, a digit line 115 may be referred to as a bit line. Word lines 110 and digit lines 115 are made of conductive materials. In some examples, word lines 110 and digit lines 115 are made of metals (e.g., copper, aluminum, gold, tungsten, etc.). Each row of memory cells 105 may be connected to a single word line 110, and each column of memory cells 105 may be connected to a single digit line 115. By activating one word line 110 and one digit line 115, a single memory cell 105 may be accessed at their intersection. The intersection of a word line 110 and digit line 115 may be referred to as an address of a memory cell.

In some architectures, the logic-storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activate the appropriate digit line 115. Thus, by activating a word line 110 and a digit line 115, a memory cell 105 may be accessed.

Upon accessing, a memory cell 105 may be read, or sensed, by sense component 125. For example, sense component 125 may compare a signal, e.g., a voltage, of the relevant digit line 115 to a reference signal (not shown) in order to determine the stored state of the memory cell 105. If digit line 115 has a higher voltage than the reference voltage, then sense component 125 may determine that the stored state in memory cell 105 was a logic 1 and vice versa. In some cases, the digit line 115 may be virtually grounded during sensing—e.g., by a switching component such as a field-effect transistor—which may allow stored charge of memory cell 105 to be transferred to another device (e.g., a sense capacitor, not shown) via the digit line 115. Circuitry in electronic communication with the switching component may be operated to compensate for an offset in threshold voltage of the switching component. For example, an offset capacitor may be discharged to apply a threshold voltage to the transistor. Virtually grounding the digit line may allow a full charge or substantially full charge of the memory cell 105 to be used for reading memory cell 105.

Sense component 125 may include various transistors or amplifiers in order to detect and amplify a difference in the signals, which may be referred to as latching. Sense component 125 may also include a sense capacitor, as described with reference to FIGS. 4. The detected logic state of memory cell 105 may then be output through column decoder 130 as output 135.

A memory cell 105 may be set, or written, by similarly activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second may be employed for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

As discussed below, ferroelectric memory cells may have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, employing sensing schemes described herein in which all or substantially all stored charge in a memory cell is extracted may enable the memory cell 105 size to be reduced, which may allow for reduced power consumption relative to other arrays employing other sensing schemes.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. For example, memory controller 140 may operate a switching component to virtually ground a digit line 115 during sensing. The switching component may be operated by charging and discharging an offset capacitor in electronic communication with the switching component. In general, the amplitude, shape, or duration of an applied voltage discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

As described herein, a ferroelectric memory cell 105 that is in electronic communication with a digit line 115 may be selected. The digit line 115 may be virtually grounded. In some cases, the digit line 115 may be virtually grounded by activating a switching component that is in electronic communication between the digit line and the sense component 125 (e.g., a sense amplifier of sense component 125). The switching component may be activated by discharging an offset capacitor that is in electronic communication with the switching component. In some examples, the switching component may be a p-type field effect transistor (FET), where discharging the offset capacitor may result in applying a threshold voltage to a gate of the p-type FET. The capacitance of the offset capacitor may be based on a threshold voltage of the p-type FET.

By way of example, a voltage may be applied to a ferroelectric capacitor of the ferroelectric memory cell 105, during a read operation, for example. This may result in the charging of a sense capacitor that is in electronic communication with the digit line 115. The charging of the sense capacitor, which may be a feature of sense component 125, may be based on applying the voltage to the ferroelectric capacitor while the digit line is virtually grounded. In some cases, all charge of the ferroelectric capacitor is extracted from the ferroelectric capacitor of ferroelectric memory cell 105. A sense amplifier, which may be an feature of sense component 125 that is in electronic communication with the digit line 115, may be activated while the digit line 115 is virtually grounded. The sense amplifier may compare a voltage of the sense capacitor to a reference voltage based on being activated.

Figure 2:
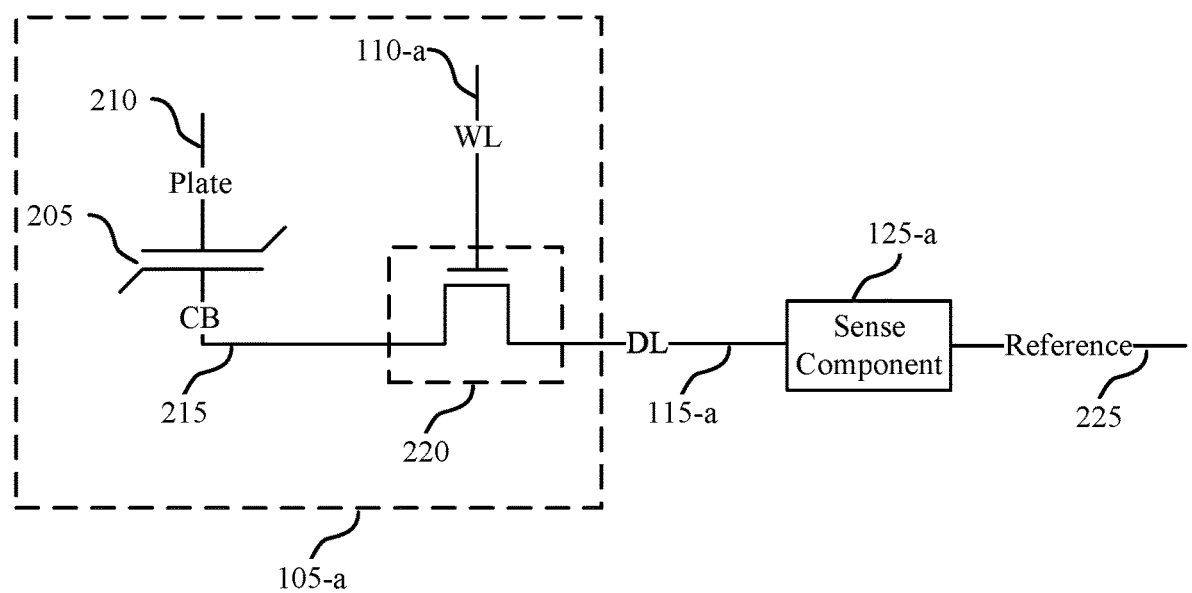
FIG. 2 illustrates an example circuit of a memory cell that supports offset compensation for ferroelectric memory cell sensing in accordance with various embodiments of the present disclosure.

FIG. 2 illustrates an example circuit 200 that supports offset compensation for ferroelectric memory cell sensing in accordance with various embodiments of the present disclosure. Circuit 200 includes a ferroelectric memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Circuit 200 also includes a reference component 225 and a logic storage component, such as capacitor 205, which may include two conductive terminals, including plate 210 and cell bottom 215. In the example of FIG. 2, the terminals of capacitor 205 are separated by an insulating ferroelectric material. As described above, various states may be stored by charging or discharging capacitor 205, i.e., polarizing the ferroelectric material of capacitor 205.

The stored state of capacitor 205 may be read or sensed by operating various elements represented in circuit 200. As depicted, capacitor 205 is in electronic communication with digit line 115-*a*. Capacitor 205 may thus be isolated from the digit line 115-*a* when selection component 220 is deactivated, and capacitor 205 may be connected to digit line 115-*a* when selection component 220 is activated to select the ferroelectric memory cell 105-*a*. In other words, ferroelectric memory cell 105-*a* may be selected using selection component 220 that is in electronic communication with ferroelectric capacitor 205, where ferroelectric memory cell 105-*a* includes selection component 220 and ferroelectric capacitor 205. In some cases, selection component 220 may be a transistor and its operation may be controlled by applying a voltage to the transistor gate, where the applied voltage has a magnitude greater than the threshold magnitude of the transistor. Word line 110-*a* may activate selection component 220; for example, a voltage may be applied to the transistor gate through word line 110-*a*.

Due to the ferroelectric material between the plates of capacitor 205, and as discussed in more detail below, capacitor 205 may not discharge upon connection to digit line 115-*a*. Instead, plate 210 may be biased by an external voltage, resulting in a change in the stored charge on capacitor 205. The change in stored charge corresponds to a logic state of capacitor 205. A voltage applied to capacitor 205 changes the charge of capacitor 205. The change in stored charge may then be compared to a reference (e.g., a reference voltage) by sense component 125-*a* in order to determine the stored logic state in memory cell 105-*a*.

The specific sensing scheme or process used to read memory cell 105-*a* may take many forms. In one example, digit line 115-*a* may have an intrinsic capacitance and develop a non-zero voltage as capacitor 205 charges or discharges in response to the voltage applied to plate 210. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of pF). The subsequent voltage of digit line 115-*a* may depend on the initial logic state of capacitor 205, and sense component 125-*a* may compare this voltage to a reference voltage provided by reference component 225. For example, a voltage may be applied to plate 210 and a voltage at cell bottom 215 may change in relation to the stored charge. The voltage at cell bottom 215 may be compared with a reference voltage at sense component 125-*a*, and a comparison to the reference voltage may indicate a change in the charge of capacitor 205 resulting from the applied voltage and thus indicate a logic state stored in memory cell 105-*a*. The relationship between charge and voltage in capacitor 205 is described in further detail with reference to FIG. 3.

Figure 4:
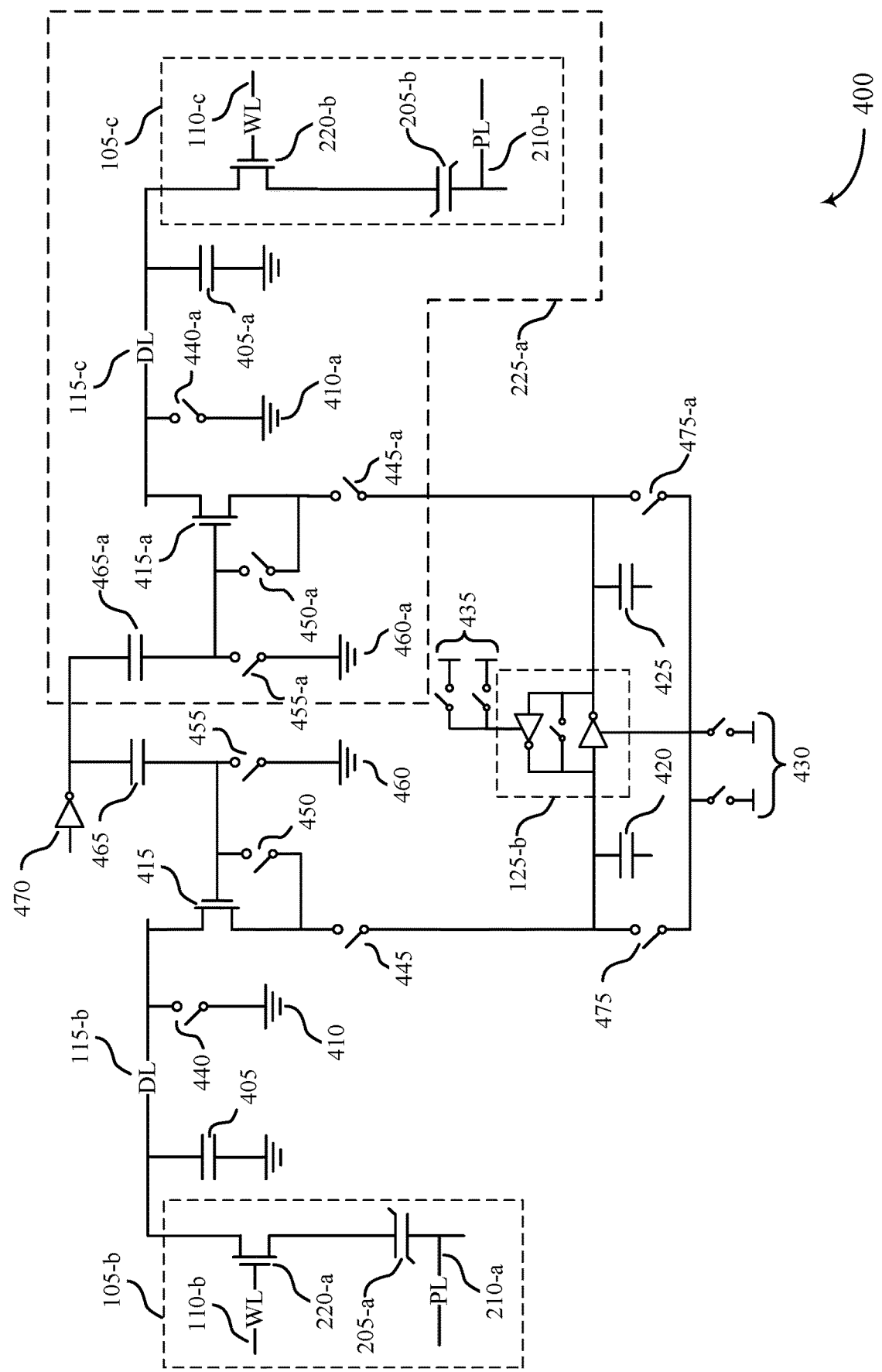
FIG. 4 illustrates an example circuit that supports offset compensation for ferroelectric memory cell sensing in accordance with various embodiments of the present disclosure.

Other sensing processes may be used, such as virtually grounding the digit line using an active switching component (as depicted in FIG. 4) during sensing. For example, a switching component that is in electronic communication with digit line 115-*a* may be activated to virtually ground digit line 115-*a* by charging and discharging an offset capacitor in electronic communication with the switching component. This activation process may compensate for variations in offsets of the switching component—e.g., offsets in threshold voltage of a transistor. When the switching component is activated, a voltage may be applied to ferroelectric capacitor 205 based on selecting ferroelectric memory cell 105-*a*. This may result in charging a sense capacitor, which may be contained in sense component 125-*a*, that is in electronic communication with ferroelectric memory cell 105-*a* while digit line 115-*a* is virtually grounded. In some cases, the charging is based on a voltage applied to ferroelectric capacitor 205 of memory cell 105-*a*, which may result in transferring a stored charge of ferroelectric memory cell 105-*a* to the sense capacitor through the switching component.

To sense the stored state, a voltage of the sense capacitor may be compared to a reference voltage. In some cases, comparing the voltage of the sense capacitor to the reference voltage includes activating a sense amplifier that is in electronic communication with the sense capacitor. In some examples, the sense amplifier is part of sense component 125-*a*. The reference voltage may result from charging a reference capacitor that is in electronic communication with the sense amplifier, and the sense amplifier may compare the voltage of the sense capacitor to the voltage of the reference capacitor.

To write memory cell 105-*a*, a voltage may be applied to capacitor 205. Various methods may be used. For example, selection component 220 may be activated through word line 110-*a* in order to electrically connect capacitor 205 to digit line 115-*a*. A voltage may be applied to capacitor 205 by controlling the voltage of plate 210 and cell bottom 215 through digit line 115-*a*. To write a logic 0, plate 210 may be taken high—i.e., a positive voltage may be applied—and cell bottom 215 may be taken low—i.e., connected to ground, virtually grounded, or negative voltage may be applied. The opposite process is performed to write a logic 1—i.e., plate 210 is taken low and cell bottom 215 is taken high.

Figure 3:
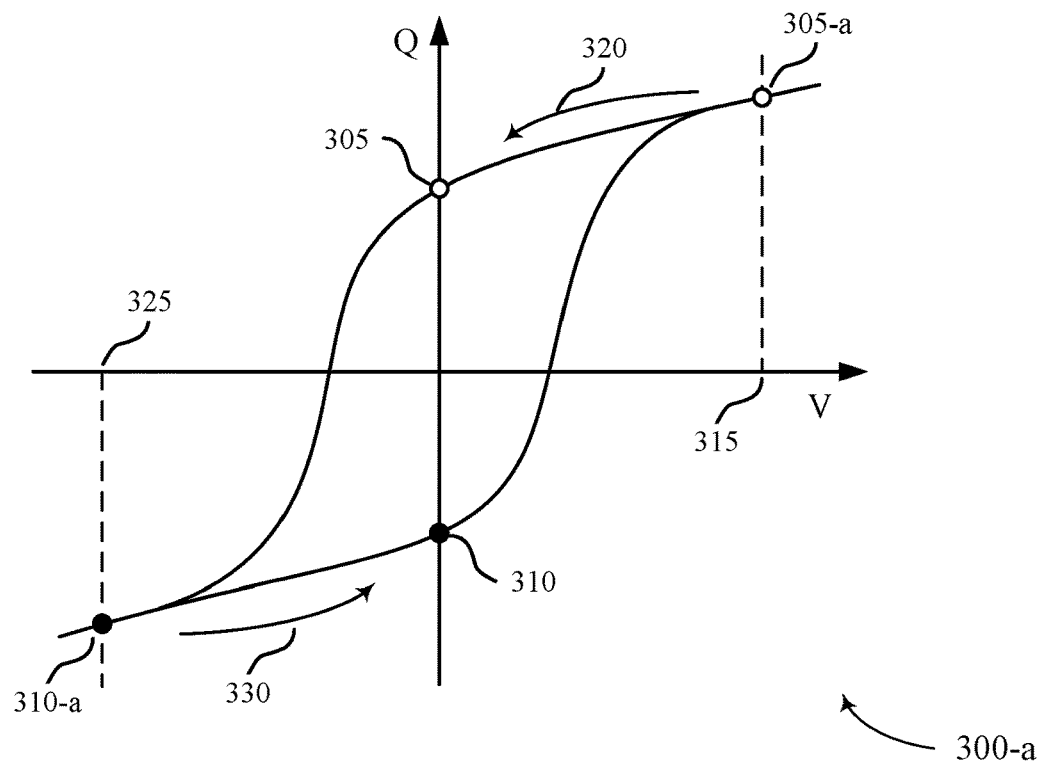
FIG. 3 illustrates example hysteresis curves for operation of a ferroelectric memory cell in accordance with various embodiments of the present disclosure.
Figure 3:
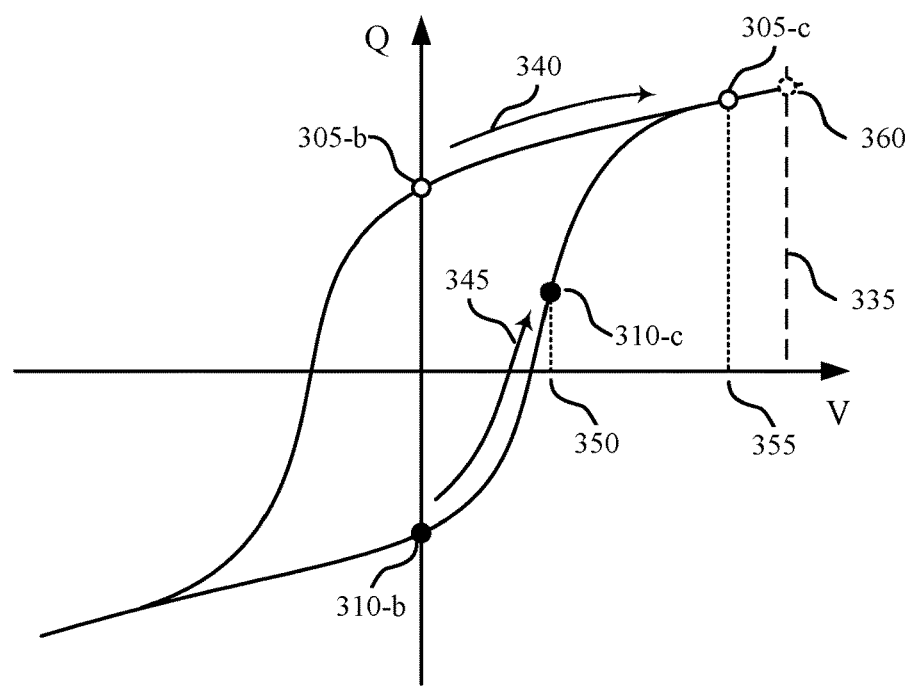

Read and write operations of capacitor 205 may be a consequence of the non-linear properties associated with a ferroelectric device. FIG. 3 illustrates examples of such non-linear properties with hysteresis curves 300-*a* and 300-*b*. Hysteresis curves 300-*a* and 300-*b* illustrate an example of a ferroelectric memory cell writing and reading process, respectively, in accordance with various embodiments of the present disclosure. Hysteresis curves 300 depict the charge, Q, stored on the ferroelectric capacitor (e.g., capacitors 205 of FIGS. 2, 4, 5, and 6) as a function of a voltage potential difference, V.

A ferroelectric material is characterized by a spontaneous electric polarization—i.e., it maintains a non-zero electric polarization in the absence of an electric field. Example ferroelectric materials include barium titanate ($BaTiO_3$), lead titanate ($PbTiO_3$), lead zirconium titanate (PZT), strontium bismuth tantalate (SBT), among others. The ferroelectric capacitors described, including capacitors 205 described with reference to FIGS. 2 and 4-6, may include these or other ferroelectric materials. Electric polarization within a ferroelectric capacitor results in a net charge at the ferroelectric material's surface and attracts opposite charge through the capacitor terminals. Thus, charge may be stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above.

Hysteresis curves 300 may be understood from the perspective of a single terminal of a capacitor. By way of example, if the ferroelectric material has a negative polarization, positive charge may accumulate at the terminal. Likewise, if the ferroelectric material has a positive polarization, negative charge may accumulate at the terminal. Additionally, the voltages in hysteresis curves 300 represent a voltage difference across the capacitor and are directional. For example, a positive voltage may be applied by applying a positive voltage to the terminal in question and maintaining the second terminal at ground (or approximately zero volts (0V)). A negative voltage may be applied by maintaining the terminal in question at ground (or 0V) and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed without a change in understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes is variable and depends on whether charge state 305-b or 310-b was initially stored. For example, hysteresis curve 300-b illustrates two possible stored charge states 305-b and 310-b. Net voltage 335 may be applied across the capacitor. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing operation and circuitry.

As discussed above, reading a DRAM memory cell may degrade or destroy the stored logic. A ferroelectric memory cell, however, may maintain the initial logic state after a read operation. For example, if charge state 305-b is stored and the read operation performed, the charge state may return to initial charge state 305-b after voltage 335 is removed, for example, by following path 340 in the opposite direction.

In some cases, the charge sensed during a read operation may depend on the intrinsic capacitance of the digit line of a memory cell. For example, if a ferroelectric capacitor of the memory cell is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

When a digit line is used for a read operation—e.g., when a digit line is not virtually grounded—then the resulting voltage of the digit line may be the difference between voltage 335 and voltage 350, or the difference between voltage 335 and voltage 355 depending on the stored logic state. By comparing the digit line voltage to a reference voltage, the initial state of the capacitor may be determined. For example, the reference voltage may be an average of the digit line logic 0 and logic 1 voltages (e.g., [(voltage 335−voltage 350)+(voltage 335−355)]/2). Upon comparison, the sensed digit line voltage may be determined to be higher or lower than the reference voltage. A value of the ferroelectric cell (i.e., a logic 0 or 1) may then be determined based on the comparison. But this approach may not allow a full charge of the capacitor to be extracted.

Other sensing schemes are possible. For example, the digit line may be maintained at 0V during memory cell sensing. In such cases, the final positions of charge states 305-c and 310-c may be independent of the digit line capacitance. For example, the digit line may be virtually grounded during sensing by the activation of a switching component. In such cases, charge states 305-c and 310-c may be co-located at charge state 360, and the full or substantially full charge (e.g., nearly all of the charge) may be extracted from the ferroelectric memory cell, which is illustrated by the difference in charge states 360 and 310-*b* being greater than the difference between charge states 310-*c* and 310-*b*. This charge may be stored on a sense capacitor, and the voltage of the sense capacitor may then be used to determine the stored state of the memory cell. This may result in a higher signal developed at the sense amplifier than a sensing scheme that relies on the intrinsic capacitance of a digit line.

A similar sensing scheme may be employed with a smaller memory cell with little or no difference in results. This may increase scaling capability of memory cells and memory arrays, for example. But as mentioned above, as memory arrays and their components decrease in size, variations in component properties, such as threshold offset, may result. Thus, memory arrays may be operated to compensate an offset in threshold voltage associated with a transistor that virtually grounds the digit line during sensing. Moreover, memory arrays may be configured with components to compensate for offsets in threshold voltage.

FIG. 4 illustrates an example circuit 400 that supports offset compensation for ferroelectric memory cell sensing in accordance with various embodiments of the present disclosure. Circuit 400 includes memory cell 105-*b*, word line 110-*b*, digit line 115-*b*, and sense component 125-*b*, which may be examples of a memory cell 105, word line 110, digit line 115, and sense component 125, respectively, as described with reference to FIGS. 1 and 2. Circuit 400 also includes capacitor 205-*a*, plate 210-*a*, and reference component 225-*a*, which may be examples of capacitor 205, plate 210, and reference component 225, respectively, as described with reference to FIG. 2. Additionally, according to the example of FIG. 4, digit line 115-*b* includes intrinsic digit line capacitance 405 and is capable of being connected to virtual ground 410 via switch 440. Circuit 400 also includes sense capacitor 420, reference capacitor 425, voltage source(s) 430, voltage source(s) 435, switches 440, 445, 450, and 455, virtual ground 460, offset capacitor 465, and voltage source 470. In some cases, voltage source 470 may charge and discharge offset capacitor 465 to activate switching component 415, which may virtually ground digit line 115-*b* and thus enabling full or substantially full charge transfer from capacitor 205-*a* to sense capacitor 420 during sensing of memory cell 105-*b*.

Reference component 225-*a* may be configured to generate or produce a reference signal and, in some cases, may include circuitry to operate one or more ferroelectric memory cells 105 that act as reference cells. In some examples, reference component 225-*a* includes memory cell 105-*c*, word line 110-*c*, and reference digit line 115-*c*, which may be examples of a memory cell 105, word line 110, and digit line 115, respectively, described with reference to FIGS. 1 and 2. Reference component 225-*a* may also include capacitor 205-*b* and plate 210-*b*, which may be examples of capacitor 205 and plate 210, respectively, as described with reference to FIG. 2. Additionally, according to the example of FIG. 4, reference digit line 115-*c* includes intrinsic reference digit line capacitance 405-*a*. Reference component 225-*a* may also include switches 440-*a*, 445-*a*, 450-*a*, and 455-*a*, virtual ground 460-*a*, and offset capacitor 465-*a*. In some cases, offset capacitors 465 and 465-*a* may be commonly connected to a voltage source, for example, voltage source 470.

Digit line 115-*b* and reference digit line 115-*c* may have an intrinsic capacitance, which is represented by intrinsic digit line capacitance 405 and 405-*a*, respectively. In the example of FIG. 4, intrinsic digit line capacitances 405 and 405-*a* is not an electrical device—e.g., it may not be a two-terminal capacitor. Instead, intrinsic digit line capacitance 405 and 405-*a* may depend on the physical characteristics, including the dimensions, of digit line 115-*b* and reference digit line 115-*c*.

Virtual ground 410 may provide a virtual ground to digit line 115-*b*. Virtual ground 410 may be separated from digit line 115-*b* through a switch 440. In some examples, switches 440, 445, 450, and 455 may be transistors. Switching component 415 may be a transistor connected in series with sense capacitor 420 and digit line 115-*b*. In some cases, the transistor comprises a p-type FET. Sense capacitor 420 and reference capacitor 425 may be capacitors configured to store charge when memory cell 105-*b* is sensed. In some cases, sense capacitor 420 and reference capacitor 425 may have the same capacitance—e.g., sense capacitor 420 and reference capacitor 425 may have a common value or rating measured in farads. Reference capacitor 425 may be in electronic communication with reference component 225-*a*. In some cases, charge produced by reference component 225-*a* may be stored on reference capacitor 425.

Sense component 125-*b* may determine the stored state of memory cell 105-*b*. Sense component 125-*b* may be or may include a sense amplifier. In some examples, sense component 125-*b* is operated by voltage source(s) 430 and 435. Sense component 125-*b* may also include sense capacitor 420, although not depicted in the example of FIG. 4.

A charging voltage may be applied by voltage source(s) 430 or 435 to sense capacitor 420 while switching component 415 is inactive, i.e., while digit line 115-*b* is electrically isolated from sense capacitor 420. In some examples, switch 445 may be open to electrically isolate digit line 115-*b* from sense capacitor 420. The charging voltage applied to sense capacitor 420 may be negative. Sense capacitor 420 may then be electrically isolated from voltage source(s) 430 or 435. Charging sense capacitor 420 may occur prior to sensing memory cell 105-*b*.

As depicted, ferroelectric memory cell 105-*b* is in electronic communication with digit line 115-*b*. Switching component 415, which is also in electronic communication with digit line 115-*b*, may be activated to virtually ground digit line 115-*b*. In some examples, switching component 415 is a p-type FET and offset capacitor 465 is in electronic communication with the gate of the p-type FET. Switching component 415 may also be connected to virtual ground 460 through switch 455. In some examples in which switching component is a p-type FET, the gate of the FET may be in electronic communication with the drain of the FET through switch 450. Activating switching component 415 to virtually ground digit line 115-*b* may include charging and discharging offset capacitor 465 with voltage source 470.

Ferroelectric memory cell 105-*b* may be selected using a selection component 220-*a* that is in electronic communication with ferroelectric capacitor 205-*a*, where ferroelectric memory cell 105-*b* includes the selection component 220-*a* and ferroelectric capacitor 205-*a*. For example, selection component 220-*a* may be a transistor (e.g., a FET) and may be activated by a voltage applied to a gate of a transistor using word line 110-*b*.

When switching component 415 is activated, a voltage may be applied to ferroelectric capacitor 205-*a* based on selecting ferroelectric memory cell 105-*b*. For example, a voltage may be applied using plate 210-*a*. This may cause sense capacitor 420, which is in electronic communication with ferroelectric memory cell 105-*b*, to be charged while digit line 115-*b* is virtually grounded. The charging may thus be based on a voltage applied to ferroelectric capacitor 205-*a* of memory cell 105-*b* and result in transferring a stored charge of ferroelectric memory cell 105-*b* to sense capacitor 420 through switching component 415.

A voltage of sense capacitor 420 may be compared to a reference voltage. In some cases, comparing the voltage of sense capacitor 420 to the reference voltage includes activating sense component 125-*b*, which is in electronic communication with sense capacitor 420. In some cases, sense component 125-*b* is or includes a sense amplifier. The reference voltage may result from charging reference capacitor 425 that is in electronic communication with sense component 125-*b*, and sense component 125-*b* may compare the voltage of sense capacitor 420 to the voltage of reference capacitor 425.

An example operation of circuit 400 may include closing switches 440, 450, and 455, and opening switch 445. Closing switch 440 initially grounds digit line 115-*b*. Switch 475 may be closed and sense capacitor 420 may be charged using voltage source 430; switch 475 may then be opened. Voltage source 470 may apply a positive voltage to offset capacitor 465 while the second terminal of the offset capacitor is in electronic communication with virtual ground 460. Switch 455 may be opened and voltage source 470 may apply a zero voltage to offset capacitor 465 to discharge capacitor 465. This may result in charge transferring to switching component 415, for example, to the gate of a FET, which may be a p-type FET.

Because the FET may be connected as a diode, the resulting equilibrium voltage may approximately be the threshold voltage of the FET. Switches 440, 450, and 455 may be opened and switch 445 may be closed. Word line 110-*b* may activate selection component 220-*a* of memory cell 105-*b*, and plate 210-*a* may apply a voltage to ferroelectric capacitor 205-*a*. This may result in charge transferring to sense capacitor 420 while digit line 115-*b* is virtually grounded by switching component 415.

Reference component 225-*a* may be operated in a similar manner. For example, switches 440-*a*, 450-*a*, and 455-*a* may be closed and switch 445-*a* may be opened. Closing switch 440-*a* initially grounds digit line 115-*b*. Switch 475-*a* may be closed and reference capacitor 425 may be charged using voltage source 430; switch 475-*a* may then be opened. Voltage source 470 may be commonly connected to offset capacitors 465 and 465-*a* and may apply a positive voltage to offset capacitor 465-*a* while its second terminal is in electronic communication with virtual ground 460-*a*. Switch 455-*a* may be opened and voltage source 470 may apply a zero voltage to offset capacitor 465-*a*. This may result in charge transferring to switching component 415, for example, to the gate of FET 415-*a*. In some cases, the threshold voltage of FET 415-*a* is not equal to the threshold voltage of FET 415. Because the FET may be connected as a diode, the resulting equilibrium voltage may approximately be the threshold voltage of FET 415-*a*. Thus, by applying a common voltage to offset capacitors 465 and 465-*a*, the respective threshold voltage of FET 415 and 415-*a* may be applied to FET 415 and 415-*a* even when the threshold voltages are not equal.

Switches 440-*a*, 450-*a*, and 455-*a* may then be opened and switch 445-*a* may be closed. Word line 110-*c* may activate selection component 220-*b* of reference memory cell 105-*c*, and plate 210-*b* may apply a voltage to ferroelectric capacitor 205-*b*. This may result in charge transferring to reference capacitor 425 while reference digit line 115-*c* is virtually grounded by switching component 415-*a*.

Figure 5:
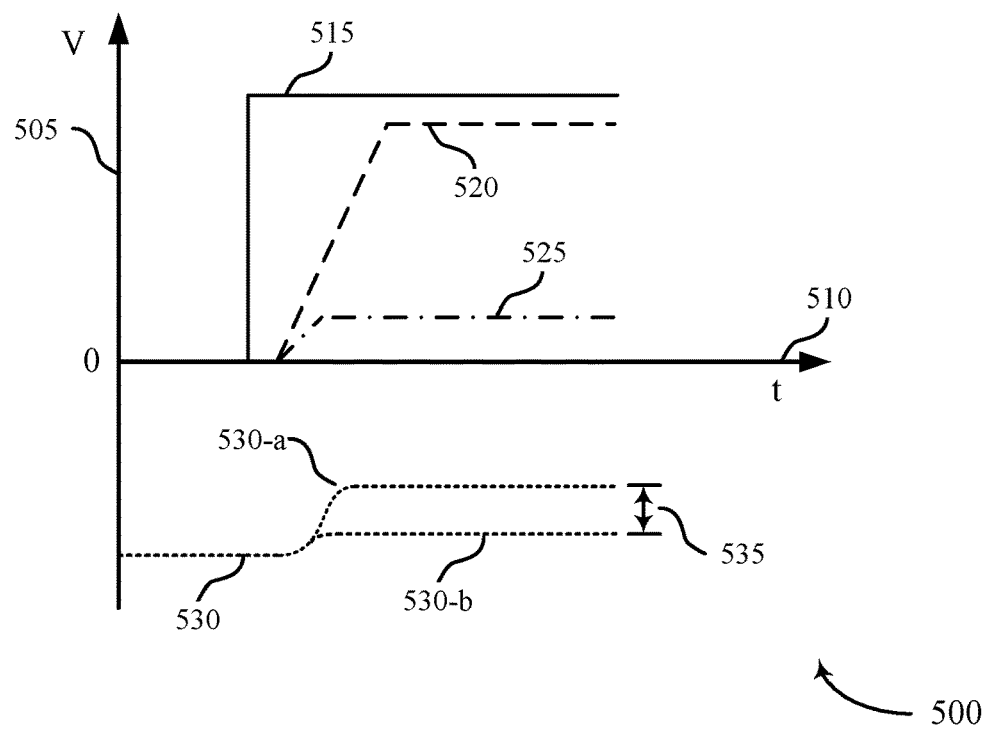
FIG. 5 illustrates a timing diagram for operating a ferroelectric memory cell without offset compensation during memory cell sensing.

FIG. 5 illustrates a timing diagram 500 for operating a ferroelectric memory cell without offset compensation during memory cell sensing in accordance with various embodiments of the present disclosure. Timing diagram 500 depicts voltage on axis 505 and time on axis 510. The voltage of various components as a function of time is thus represented on timing diagram 500. For example, timing diagram 500 includes word line voltage 515, plate voltage 520, digit line voltage 525, and sense capacitor voltage 530. Timing diagram 500 depicts an example operation of memory cell sensing without offset compensation. FIG. 5 is described below with reference to components of preceding figures.

As discussed in FIG. 4, the sense capacitor 420 may be charged initially to a negative voltage, as depicted by sense capacitor voltage 530. Word line voltage 515 may be applied to a word line 110 associated with a ferroelectric memory cell 105. Plate voltage 520 may be applied to a plate 210 of the ferroelectric memory cell 105. Digit line voltage 525 may be zero initially but then may rise to a non-zero voltage after plate voltage 520 is applied. The rise in digit line voltage 525 may be due to the switching component, such as switching component 415 of FIG. 4, not being fully activated.

For example, in an example in which switching component 415 is a FET and the appropriate threshold voltage is not applied, the FET may not be activated until the digit line increases in voltage. Once digit line voltage 525 increases sufficiently to activate the switching component, charge may transfer to a sense capacitor 420, resulting in a change in sense capacitor voltage 530. The change in sense capacitor voltage 530 may depend on the logic state of the memory cell 105. For example, if a logic 0 is stored, sense capacitor voltage 530 may change to sense capacitor voltage 530-*a*. If a logic 1 is stored, sense capacitor voltage 530 may change to sense capacitor voltage 530-*b*. The difference between sense capacitor voltage 530-*a* and sense capacitor voltage 530-*b* may be known as the sense window 535. The stored logic state may be determined by comparing sense capacitor voltage 530-*a* or 530-*b* to a reference voltage. For example, the reference voltage is a value between sense capacitor voltage 530-*a* and 530-*b*. Sense window 535 may be smaller here than if the digit line voltage 525 had been maintained at zero volts because the rise in digit line voltage 525 may imply that not all charge was extracted from the memory cell 105.

Figure 6:
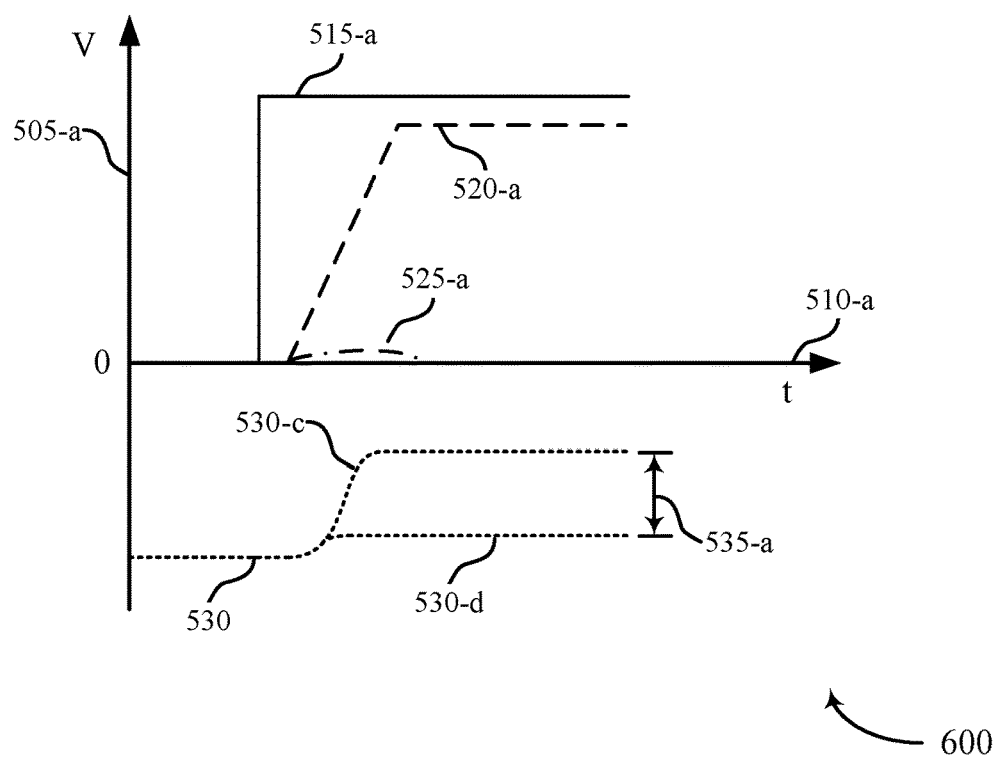
FIG. 6 illustrates a timing diagram for operating a ferroelectric memory cell that supports offset compensation during memory cell sensing in accordance with various embodiments of the current disclosure.

FIG. 6 illustrates a timing diagram 600 for operating a ferroelectric memory cell that supports offset compensation for ferroelectric memory cell sensing in accordance with various embodiments of the present disclosure. Timing diagram 600 depicts voltage on axis 505-*a* and time on axis 510-*a*. The voltage of various components as a function of time is thus represented on timing diagram 600. For example, timing diagram 600 includes word line voltage 515-*a*, plate voltage 520-*a*, digit line voltage 525-*a*, and sense capacitor voltage 530. Timing diagram 600 depicts an example operation of memory cell sensing with offset compensation, such as the circuit described in FIG. 4. FIG. 6 is described below with reference to components of preceding figures.

As discussed in FIG. 4, the sense capacitor 420 may be charged initially to a negative voltage, as depicted by sense capacitor voltage 530. Word line voltage 515-*a* may be applied to a word line 110 associated with a ferroelectric memory cell 105. Plate voltage 520-*a* may be applied to a plate 210 of the ferroelectric memory cell 105. Digit line voltage 525-*a* may be approximately zero, or virtually grounded, during sensing as discussed previously. For example, a switching component 415 may virtually ground the digit line during sensing. An offset in threshold voltage of switching component 415 may thus be compensated as described in FIG. 4. In some cases, the digit line voltage 525-a temporarily deviates from zero.

With digit line voltage 525-a at approximately 0V while word line voltage 515-a and plate voltage 520-a are applied, charge may transfer to a sense capacitor 420, resulting in a change in sense capacitor voltage 530. As discussed above, the change in sense capacitor voltage 530 may depend on the logic state of the memory cell 105. For example, if a logic 0 is stored, sense capacitor voltage 530 may change to sense capacitor voltage 530-c. If a logic 1 is stored, sense capacitor voltage 530 may change to sense capacitor voltage 530-d. The difference between sense capacitor voltage 530-c and sense capacitor voltage 530-d may be sense window 535-a. Sense window 535-a may be larger here than if a circuit is operated without compensating threshold offset of switching component 415 (as depicted in FIG. 5) due to a larger fraction of the stored charge extracted based on virtually grounding the digit line. The stored logic state may be determined by comparing sense capacitor voltage 530-c or 530-d to a reference voltage. For example, the reference voltage may be a value between sense capacitor voltage 530-c and 530-d.

Figure 7:
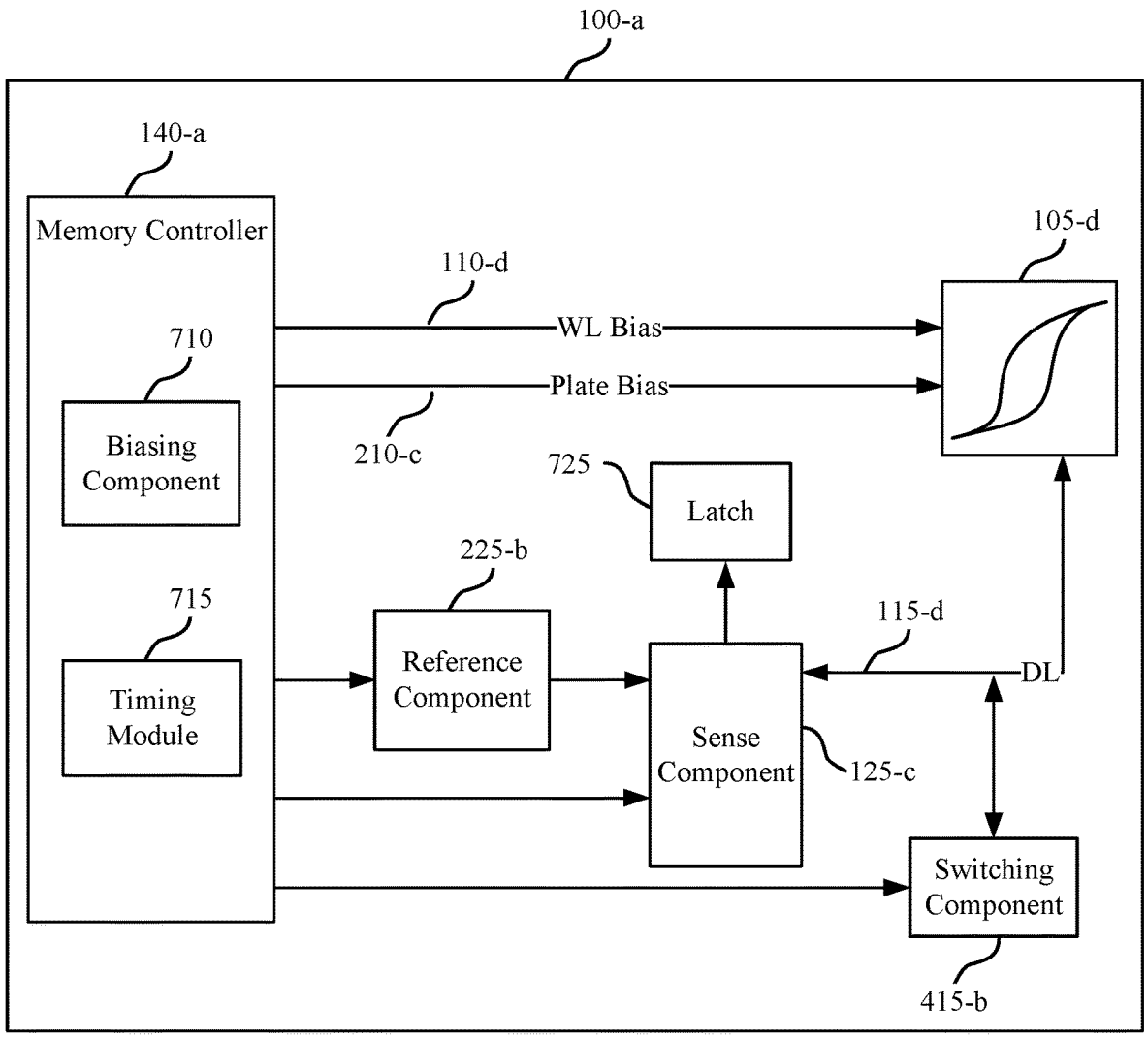
FIG. 7 illustrates an example ferroelectric memory array that supports offset compensation during memory cell sensing in accordance with various embodiments of the present disclosure.

FIG. 7 shows a block diagram 700 of a memory array 100-a that supports offset compensation for ferroelectric memory cell sensing in accordance with various embodiments of the present disclosure. Memory array 100-a may be referred to as an electronic memory apparatus and may include memory controller 140-a and memory cell 105-d, which may be examples of memory controller 140 and memory cell 105 described with reference to FIGS. 1, 2, and 4. Memory controller 140-a may include biasing component 710 and timing component 715 and may operate memory array 100-a as described in FIGS. 1-6. Memory controller 140-a may be in electronic communication with word line 110-d, digit line 115-d, sense component 125-c, plate 210-c, reference component 225-b, and switching component 415-b, which may be examples of word line 110, digit line 115, sense component 125, plate 210, reference component 225, and switching component 415 described with reference to FIGS. 1, 2, 4-6.

In some examples, switching component 415-b is in electronic communication with digit line 115-d, as discussed above. Switching component 415-b may also be in electronic communication with an offset capacitor (not shown), as depicted in and described with reference to FIG. 4. Offset capacitor may be operated by memory controller 140-a. Memory array 100-a may also include latch 725. The components of memory array 100-a may be in electronic communication with one another and may perform the functions described with reference to FIGS. 1-6.

Memory controller 140-a may be configured to activate word line 110-d, sense component 125-c, plate 210-c, reference component 225-b, or switching component 415-b by applying voltages to those various nodes. For example, biasing component 710 may be configured to apply a voltage to operate memory cell 105-d to read or write memory cell 105-d as described above. In some cases, memory controller 140-a may include a row decoder, column decoder, or both, as described with reference to FIG. 1. This may enable memory controller 140-a to access one or more memory cells 105. Biasing component 710 may also provide voltage potentials to reference component 225-b in order to generate a reference signal for sense component 125-c. Additionally, biasing component 710 may provide voltage potentials for the operation of sense component 125-c. In some cases, memory controller 140-a may charge and discharge an offset capacitor that is in electronic communication with switching component 415-b in order to compensate for threshold offset of switching component 415-b.

In some examples, memory controller 140-a may perform its operations using timing component 715. For example, timing component 715 may control the timing of the various word line or plate biasing, including timing for switching and voltage application to perform the memory functions, such as reading and writing, discussed herein. In some cases, timing component 715 may control the operations of biasing component 710.

Reference component 225-b may generate a reference signal for sense component 125-c. Reference component 225-b may, for example, include circuitry specifically configured to produce a reference signal. In some cases, reference component 225-b is another ferroelectric memory cell. In some examples, reference component 225-b is configured to output a voltage with a value between the two sense voltages, as described with reference to FIG. 3. Or reference component 225-b may be designed to output a virtual ground voltage, i.e., approximately 0V.

Sense component 125-c may compare a signal from memory cell 105-d (through digit line 115-d) with a reference signal from reference component 225-b. Upon determining the logic state, sense component 125-c may then store the output in latch 725, where it may be used in accordance with the operations of an electronic device using memory array 100-a.

Figure 8:
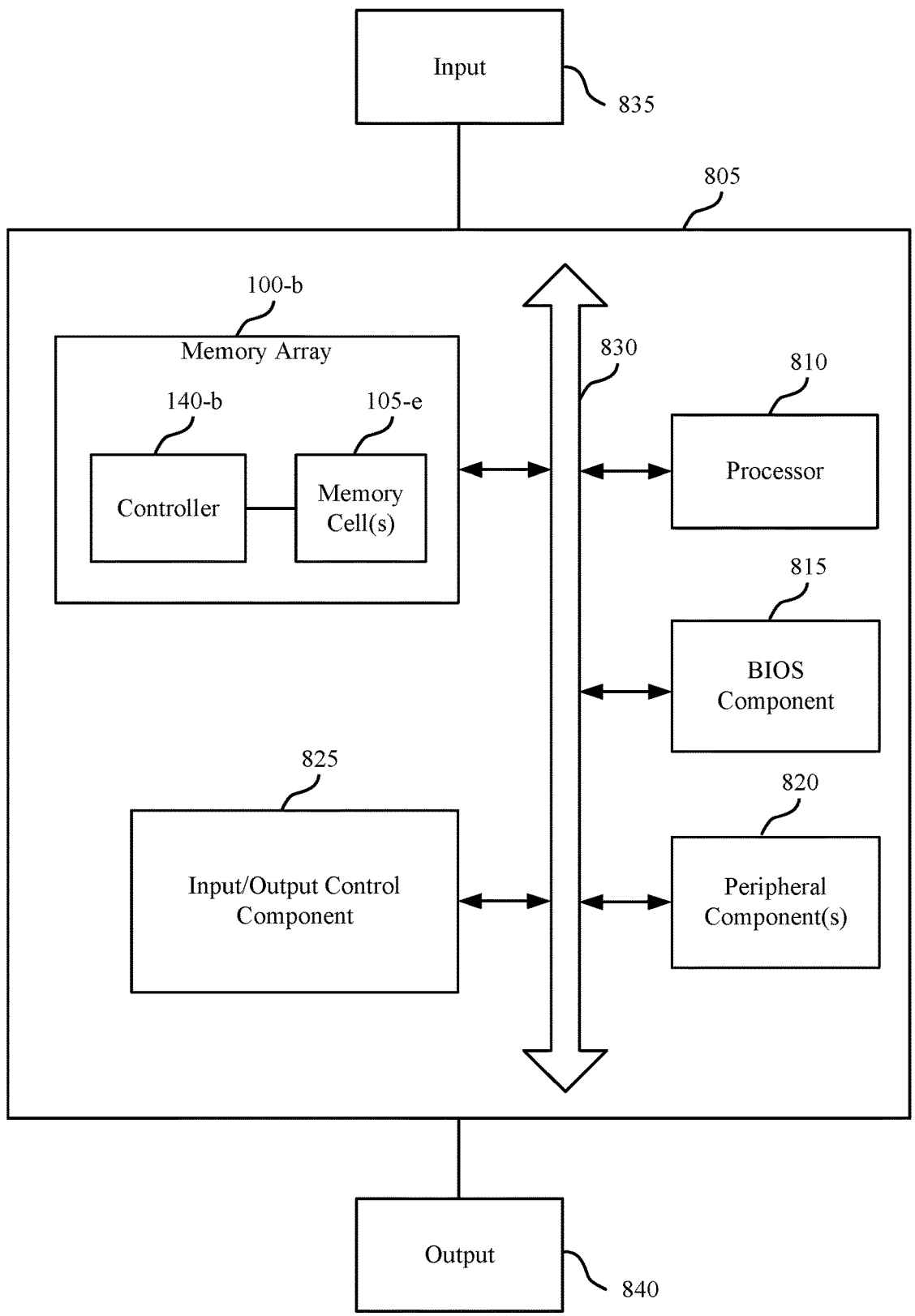
FIG. 8 illustrates a device, including a memory array, that supports offset compensation during memory cell sensing in accordance with various embodiments of the present disclosure.

FIG. 8 shows a diagram of a system 800 that supports offset compensation for ferroelectric memory cell sensing in accordance with various embodiments of the present disclosure. System 800 may include a device 805, which may be or include a printed circuit board to connect or physically support various components. Device 805 may include a memory array 100-b, which may be an example of memory array 100 described in FIG. 1 and FIG. 7. Memory array 100-b may contain memory controller 140-b and memory cell(s) 105-e, which may be examples of memory controller 140 described with reference to FIGS. 1 and 7 and memory cells 105 described with reference to FIGS. 1-7. Device 805 may also include a processor 810, BIOS component 815, peripheral component(s) 820, and input/output control component 825. The components of device 805 may be in electronic communication with one another through bus 830.

Processor 810 may be configured to operate memory array 100-b through memory controller 140-b. In some cases, processor 810 may perform the functions of memory controller 140 described with reference to FIGS. 1 and 7. For example, memory controller 140-b may charge and discharge an offset capacitor 465 to activate a switching component that may virtually ground a digit line 115 in order to extract the stored charge in memory cell 105-e. In other cases, memory controller 140-b may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including offset compensation for ferroelectric memory cell sensing. Processor 810 may, for example, be configured to execute computer-readable instructions stored in memory array 100-b to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 825 may manage data communication between processor 810 and peripheral component(s) 820, input 835, or output 840. Input/output control component 825 may also manage peripherals not integrated into device 805. In some cases, input/output control component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output component 825.

Output 840 may represent a device or signal external to device 805 configured to receive output from device 805 or any of its components. Examples of output 840 may include a display, audio speakers, a printing device, another processor or printed circuit board, etc. In some cases, output 840 may be a peripheral that interfaces with device 805 via peripheral component(s) 820 or may be managed by input/output component 825.

The components of memory controller 140-b, device 805, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
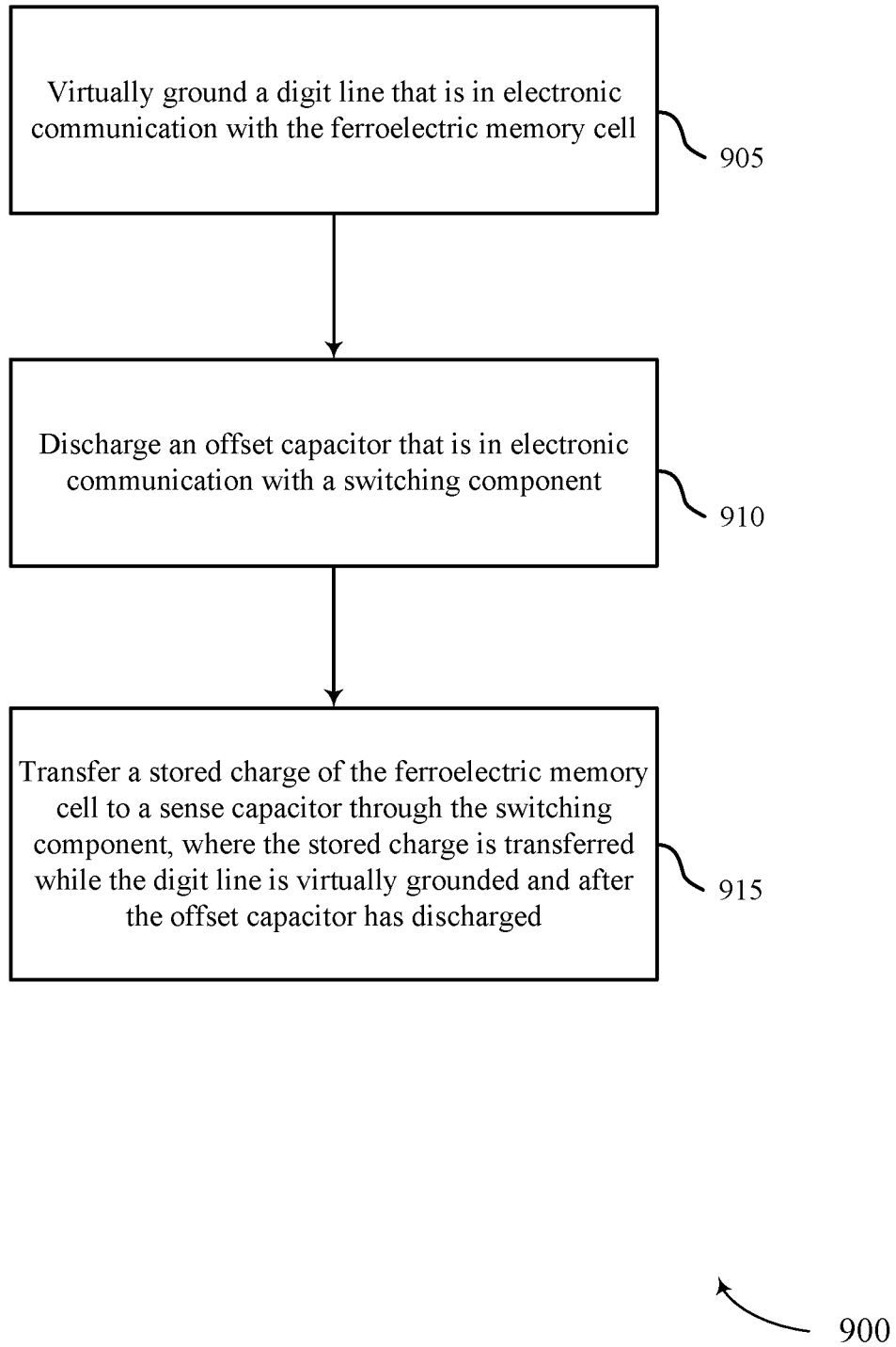
FIGS. 9-11 are flowcharts that illustrate a method or methods for offset compensation during memory cell sensing in accordance with various embodiments of the present disclosure.

FIG. 9 shows a flowchart illustrating a method 900 of operating a ferroelectric memory cell with offset compensation in accordance with various embodiments of the present disclosure. The operations of method 900 may be implemented by a memory array 100 as described with reference to FIGS. 1-8. For example, the operations of method 900 may be performed by a memory controller 140 as described with reference to FIGS. 1, 7, and 8. In some examples, a memory controller 140 may execute a set of codes to control the functional elements of the memory array 100 to perform the functions described below. Additionally or alternatively, the memory controller 140 may perform some or all of the functions described below using special-purpose hardware.

At block 905, the method may include virtually grounding a digit line that is in electronic communication with the ferroelectric memory cell as described with reference to FIGS. 1-6. In certain examples, the operations of block 905 may be performed by the memory controller 140, as described with reference to FIGS. 1, 7, and 8.

At block 910, the method may include discharging an offset capacitor that is in electronic communication with a switching component as described with reference to FIGS. 1-6. In certain examples, the operations of block 910 may be performed by the memory controller 140 or voltage source 470 as described with reference to FIGS. 1, 4, 7, and 8. Discharging the offset capacitor may apply a threshold voltage to the switching component.

At block 915, the method may include transferring a stored charge of the ferroelectric memory cell to a sense capacitor through the switching component, where the stored charge is transferred while the digit line is virtually grounded and after the offset capacitor has discharged as described with reference to FIGS. 1-6. In certain examples, the operations of block 915 may be performed by the memory controller 140 and sense capacitor 420, as described with reference to FIGS. 1, 7, and 8.

Figure 10:
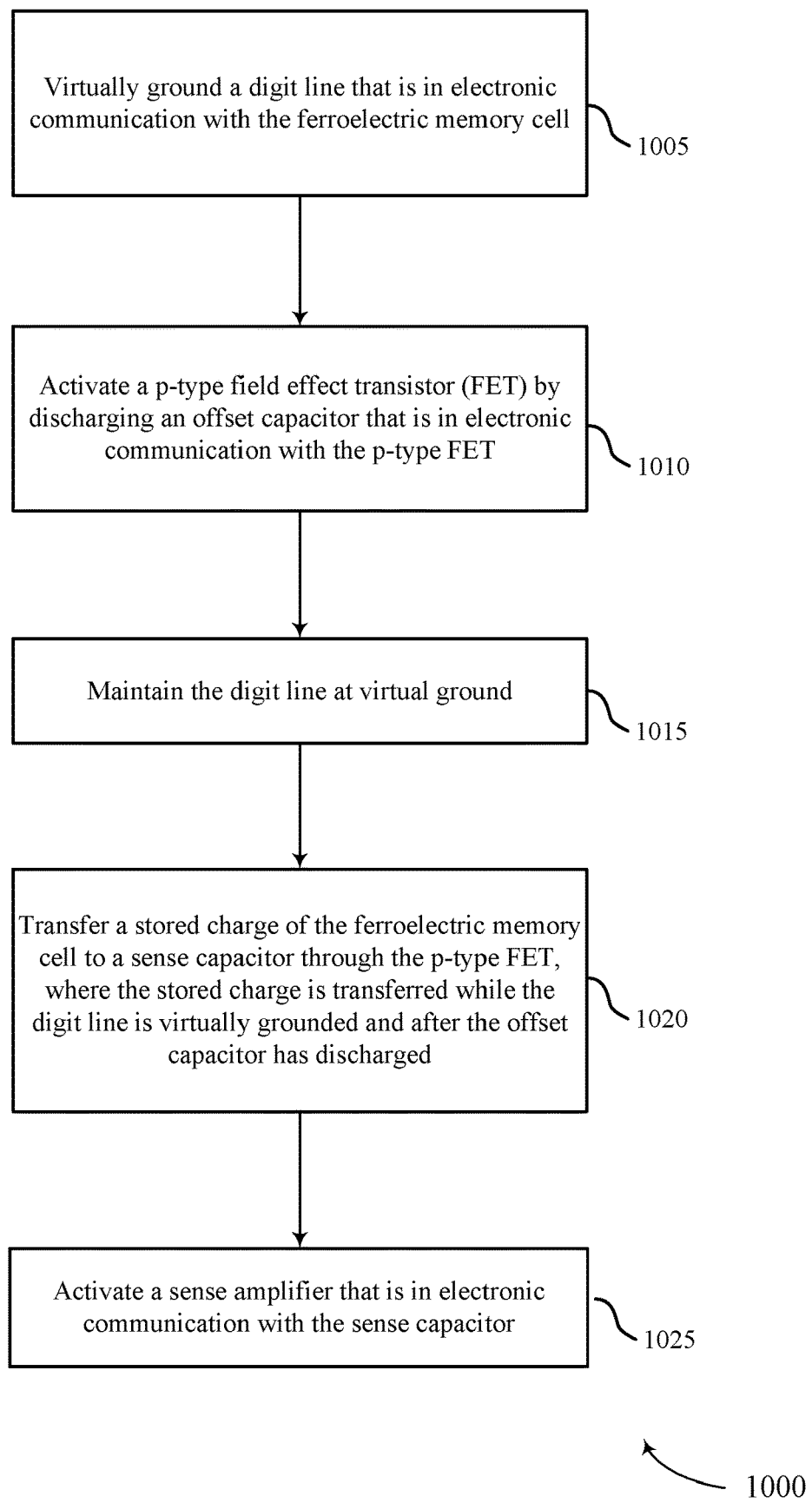

FIG. 10 shows a flowchart illustrating a method 1000 of operating a ferroelectric memory cell with offset compensation in accordance with various embodiments of the present disclosure. The operations of method 1000 may be implemented by a memory array 100 as described with reference to FIGS. 1-8. For example, the operations of method 1000 may be performed by a memory controller 140 as described with reference to FIGS. 1, 7, and 8. In some examples, a memory controller 140 may execute a set of codes to control the functional elements of the memory array 100 to perform the functions described below. Additionally or alternatively, the memory controller 140 may perform the functions described below using special-purpose hardware.

At block 1005, the method may include virtually grounding a digit line that is in electronic communication with the ferroelectric memory cell as described with reference to FIGS. 1-6. In certain examples, the operations of block 1005 may be performed by the memory controller 140, as described with reference to FIGS. 1, 7, and 8.

At block 1010, the method may include activating a p-type field effect transistor (FET) by discharging an offset capacitor that is in electronic communication with the p-type FET as described with reference to FIGS. 1-6. In certain examples, the operations of block 1010 may be performed by the memory controller 140, as described with reference to FIGS. 1, 7, and 8. Discharging the offset capacitor may apply a threshold voltage to the switching component. In some instances, the capacitance of the offset capacitor may be based on a threshold voltage of the p-type FET.

At block 1015, the method may include maintaining the digit line at virtual ground as described with reference to FIGS. 1-6. In certain examples, the operations of block 1015 may be performed by the memory controller 140, as described with reference to FIGS. 1, 7, and 8. In some cases, activating the switching component, e.g., the p-type FET may maintain the digit line at virtual ground.

At block 1020, the method may include transferring a stored charge of the ferroelectric memory cell to a sense capacitor through the p-type FET, where the stored charge is transferred while the digit line is virtually grounded and after the offset capacitor has discharged as described with reference to FIGS. 1-6. In certain examples, the operations of block 1020 may be performed by the memory controller 140 and sense capacitor 420, as described with reference to FIGS. 1, 7, and 8.

At block 1025, the method may include activating a sense amplifier that is in electronic communication with the sense capacitor as described with reference to FIGS. 1-6. In certain examples, the operations of block 1025 may be performed by the memory controller 140, sense component 125, and/or sense capacitor 420, as described with reference to FIGS. 1, 7, and 8. In some instances, the sense amplifier may compare a voltage of the sense capacitor to a reference voltage based on being activated.

The method may also include applying a voltage to a ferroelectric capacitor of a ferroelectric memory cell, which may result in the charging of the sense capacitor that is in electronic communication with the digit line. The method may also include selecting the ferroelectric memory cell, where selecting the ferroelectric memory cell may include activating a selection component that is in electronic communication with the ferroelectric capacitor and the digit line, where the ferroelectric memory cell comprises the selection component and the ferroelectric capacitor. The method may also include applying a voltage to a ferroelectric capacitor of the ferroelectric memory cell.

Figure 11:
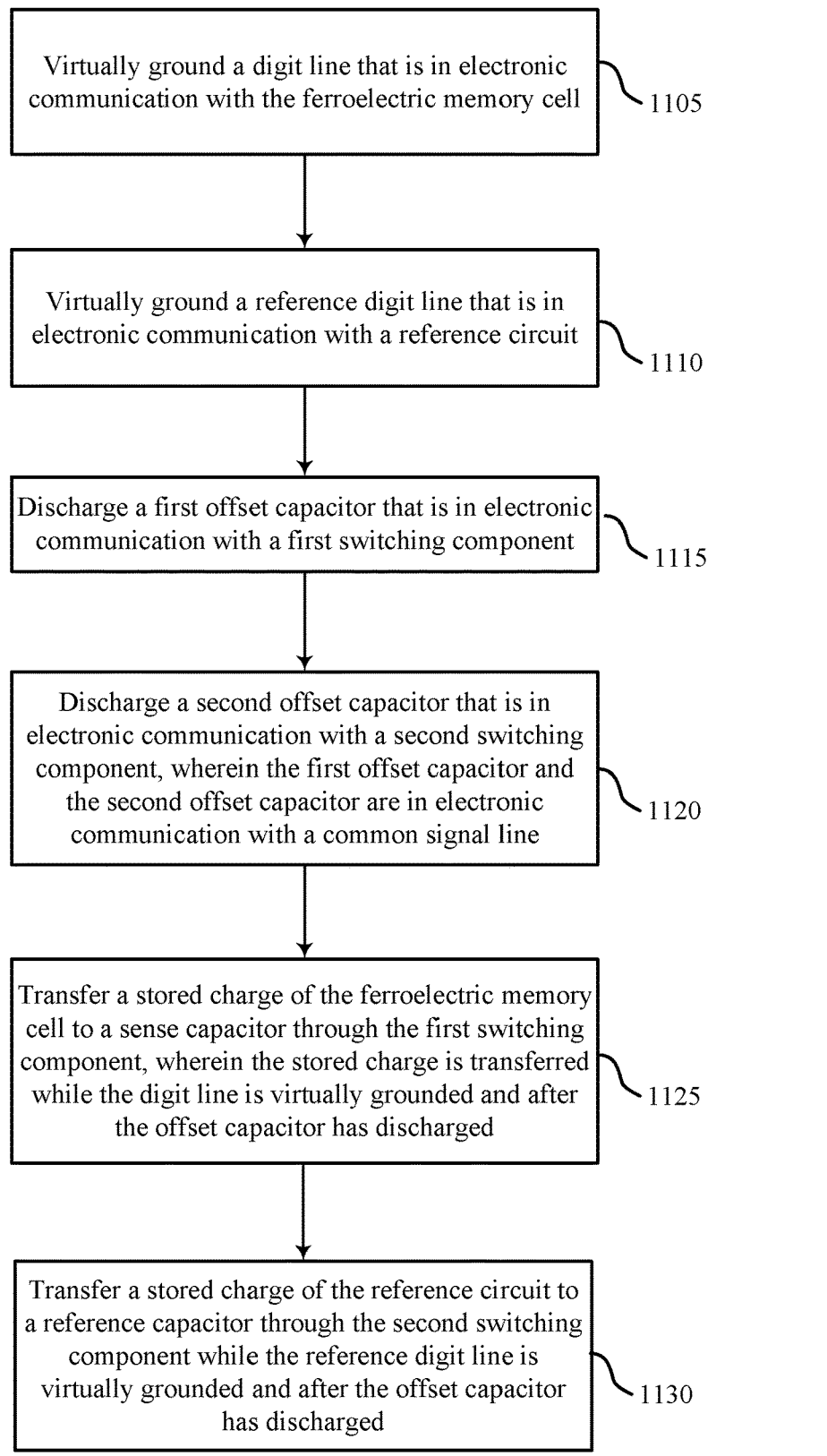

FIG. 11 shows a flowchart illustrating a method 1100 of operating a ferroelectric memory cell employing offset compensation in accordance with various embodiments of the present disclosure. The operations of method 1100 may be implemented by a memory array 100 as described with reference to FIGS. 1-8. For example, the operations of method 1100 may be performed by a memory controller 140 as described with reference to FIGS. 1, 7, and 8. In some examples, a memory controller 140 may execute a set of codes to control the functional elements of the memory array 100 to perform the functions described below. Additionally or alternatively, the memory controller 140 may perform the functions described below using special-purpose hardware.

At block 1105, the method may include virtually grounding a digit line that is in electronic communication with the ferroelectric memory cell as described with reference to FIGS. 1-6. In certain examples, the operations of block 1105 may be performed by the memory controller 140, as described with reference to FIGS. 1, 7, and 8.

At block 1110, the method may include virtually grounding a reference digit line that is in electronic communication with a reference circuit as described with reference to FIGS. 1-6. In certain examples, the operations of block 1110 may be performed by the memory controller 140, as described with reference to FIGS. 1, 7, and 8. In some cases, the reference circuit may include one or more ferroelectric memory cells 105.

At block 1115, the method may include discharging a first offset capacitor that is in electronic communication with a first switching component as described with reference to FIGS. 1-6. In certain examples, the operations of block 1115 may be performed by the memory controller 140, as described with reference to FIGS. 1, 7, and 8. Discharging the first offset capacitor may allow a threshold voltage to be applied to the first switching component.

At block 1120, the method may include discharging a second offset capacitor that is in electronic communication with a second switching component, wherein the first offset capacitor and the second offset capacitor are in electronic communication with a common signal line as described with reference to FIGS. 1-6. In certain examples, the operations of block 1120 may be performed by the memory controller 140, as described with reference to FIGS. 1, 7, and 8. In some cases, the first and second switching components may be p-type FETs. Discharging the second offset capacitor may apply a threshold voltage to the gate of the second p-type FET. In some cases, the threshold voltages of the first and second p-type FETs are not equal, yet both p-type FETs may achieve their threshold voltage by discharging the offset capacitors using the common signal line.

At block 1125, the method may include transferring a stored charge of the ferroelectric memory cell to a sense capacitor through the first switching component, where the stored charge is transferred while the digit line is virtually grounded and after the offset capacitor has discharged as described with reference to FIGS. 1-6. In certain examples, the operations of block 1125 may be performed by the memory controller 140 and sense capacitor 420, as described with reference to FIGS. 1, 7, and 8.

At block 1130, the method may transferring a stored charge of the reference circuit to a reference capacitor through the second switching component while the reference digit line is virtually grounded and after the offset capacitor has discharged as described with reference to FIGS. 1-6. In certain examples, the operations of block 1130 may be performed by the memory controller 140 and sense capacitor 420, as described with reference to FIGS. 1, 7, and 8.

Thus, methods 900, 1000, and 1100 may provide for offset compensation during ferroelectric memory cell sensing. It should be noted that methods 900, 1000, and 1100 describe possible implementations, and the operations and steps may be rearranged or otherwise modified such that other implementations are possible. In some examples, features from two or more of the methods 900, 1000, and 1100 may be combined.

The description herein provides examples and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounding," as the terms are used herein, means connecting to a virtual ground or to ground.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Transistors discussed herein may represent a field effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
    activating a first switching component to couple a digit line with a virtual ground;
    deactivating a second switching component to discharge a first charge of an offset capacitor to a gate of a third switching component based at least in part on activating the second switching component;
activating the third switching component to couple the digit line with a sense component based at least in part on discharging the first charge of the offset capacitor; and
transferring a second charge stored by a memory cell to the sense component based at least in part on activating the third switching component.

2. The method of claim 1, further comprising:
deactivating a fourth switching component to isolate the digit line from a sense capacitor and a sense amplifier, wherein activating the first switching component is based at least in part on deactivating the fourth switching component.

3. The method of claim 1, further comprising:
activating a fifth switching component to couple a sense capacitor with a voltage source, wherein deactivating the second switching component is based at least in part on activating the first switching component.

4. The method of claim 3, wherein the sense capacitor is charged with a voltage based at least in part on activating the fifth switching component.

5. The method of claim 4, further comprising:
deactivating the fifth switching component based at least in part coupling the sense capacitor with the voltage source.

6. The method of claim 1, further comprising:
applying a voltage to a first node of the offset capacitor while a second node of the offset capacitor is coupled with the virtual ground to charge the offset capacitor, wherein applying the voltage to the first node is based at least in part on activating the first switching component.

7. The method of claim 6, further comprising:
activating the second switching component to couple the second node of the offset capacitor with the virtual ground, wherein applying the voltage to the first node is based at least in part on activating the second switching component.

8. The method of claim 7, further comprising:
deactivating a sixth switching component to isolate the offset capacitor from the digit line, wherein applying the voltage to the first node is based at least in part on deactivating the sixth switching component.

9. The method of claim 8, wherein the deactivating of the second switching component and the deactivating of the sixth switching component occur before applying the voltage to the first node of the offset capacitor.

10. The method of claim 1, wherein discharging the first charge of the offset capacitor further comprises:
applying a zero voltage to a first node of the offset capacitor before deactivating the second switching component.

11. The method of claim 10, wherein deactivating the second switching component isolates the offset capacitor from the virtual ground.

12. The method of claim 1, wherein activating the third switching component is based at least in part on receiving a discharged voltage from a second node of the offset capacitor.

13. The method of claim 12, wherein the received discharge voltage from the second node of the offset capacitor thresholds the third switching component.

14. The method of claim 1, wherein transferring the second charge stored by the memory cell to the sense component further comprises:
deactivating the first switching component to isolate the digit line from the virtual ground; and
deactivating a fourth switching component to couple the digit line to a sense capacitor.

15. An apparatus, comprising:
a memory cell coupled with a digit line;
a sense component coupled with the memory cell via the digit line;
an offset capacitor; and
a controller operable to:
activate a first switching component to couple the digit line with a virtual ground;
deactivate a second switching component to discharge a first charge of the offset capacitor to a gate of a third switching component based at least in part on activating the second switching component;
activate the third switching component to couple the digit line with the sense component based at least in part on discharging the first charge of the offset capacitor; and
transfer a second charge stored by the memory cell to the sense component based at least in part on activating the third switching component.

16. The apparatus of claim 15, wherein the controller is further operable to:
deactivate a fourth switching component to isolate the digit line from a sense capacitor and a sense amplifier, wherein activating the first switching component is based at least in part on deactivating the fourth switching component.

17. The apparatus of claim 15, wherein the controller is further operable to:
activate a fifth switching component to couple a sense capacitor with a voltage source, wherein deactivating the second switching component is based at least in part on activating the first switching component.

18. The apparatus of claim 15, wherein the controller is further operable to:
apply a voltage to a first node of the offset capacitor while a second node of the offset capacitor is coupled with the virtual ground to charge the offset capacitor, wherein applying the voltage to the first node is based at least in part on activating the first switching component.

19. The apparatus of claim 15, wherein the controller is further operable to:
apply a zero voltage to a first node of the offset capacitor before deactivating the second switching component.

20. An apparatus, comprising:
a first switching component operable to couple a digit line with a virtual ground;
a second switching component operable to discharge an offset capacitor based at least in part on activating the second switching component; and
a third switching component operable to receive a discharge of the offset capacitor at a gate of the third switching component, and couple the digit line with a sense component based at least in part on receiving the discharge of the offset capacitor,
wherein a charge stored by a memory cell is transferred to the sense component based at least in part on the third switching component coupling the digit line with the sense component.

* * * * *